(12) United States Patent
Phillips

(10) Patent No.: US 10,211,846 B1
(45) Date of Patent: Feb. 19, 2019

(54) TECHNIQUES FOR AMPLIFIER OUTPUT VOLTAGE LIMITING

(71) Applicant: Analog Devices, Inc., Norwood, MA (US)

(72) Inventor: Kerry Brent Phillips, Haverhill, MA (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 15/804,115

(22) Filed: Nov. 6, 2017

(51) Int. Cl.
*H03F 1/52* (2006.01)
*H03F 3/45* (2006.01)
*H03M 1/12* (2006.01)

(52) U.S. Cl.
CPC .......... *H03M 1/1295* (2013.01); *H03F 1/52* (2013.01); *H03F 3/45174* (2013.01); *H03F 2200/78* (2013.01); *H03F 2203/45186* (2013.01); *H03F 2203/45218* (2013.01)

(58) Field of Classification Search
None
See application file for complete search history.

(56) References Cited

U.S. PATENT DOCUMENTS

| 5,973,561 | A  | * | 10/1999 | Heaton | H03F 1/48 327/309 |
| 6,614,282 | B2 | * | 9/2003 | Abe | H03M 1/1295 327/321 |
| 8,063,665 | B1 | * | 11/2011 | Rohilla | H03K 19/01858 326/26 |
| 9,444,434 | B1 |   | 9/2016 | Tanase et al. | |

FOREIGN PATENT DOCUMENTS

EP    0178044 A2 * 4/1986 .......... H03M 1/1295
JP    08111616 A  *  4/1996

OTHER PUBLICATIONS

"LMH6553 900 MHz Fully Differential Amplifier With Output Limiting Clamp".

* cited by examiner

*Primary Examiner* — Howard Williams
(74) *Attorney, Agent, or Firm* — Schwegman Lundberg & Woessner, P.A.

(57) ABSTRACT

Techniques for limiting the output voltage of an amplifier without directly affecting an output current of the amplifier are provided. In an example, an amplifier can include a plurality of amplifier stages configured to receive an input voltage and to provide an output voltage as a function of the input voltage, and a comparator configured to receive a voltage limit and a representation of the output voltage of the amplifier, to adjust current at an input to a first amplifier stage of the plurality of amplifier stages when the output voltage violates the voltage limit, and to clamp the output voltage at an offset from the voltage limit.

20 Claims, 6 Drawing Sheets

TECHNIQUES FOR AMPLIFIER OUTPUT VOLTAGE LIMITING

FIELD OF THE DISCLOSURE

This application applies to techniques for limiting output current of an amplifier, including limiting output current of the amplifier without directly shunting the output current.

BACKGROUND

Analog-to-digital converters (ADCs) and ADC circuits can provide optimal performance when the sensed voltage range matches the input voltage range of the ADC. Unfortunately, anomalies can occur that allow the input voltage to make excursions outside the input voltage range. Driver amplifiers or buffers are available that can clamp the input voltage, however, such solutions can be inefficient and can disrupt other characteristics of a system such as a reference voltage source used by other ADC circuits.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

Figure 1:
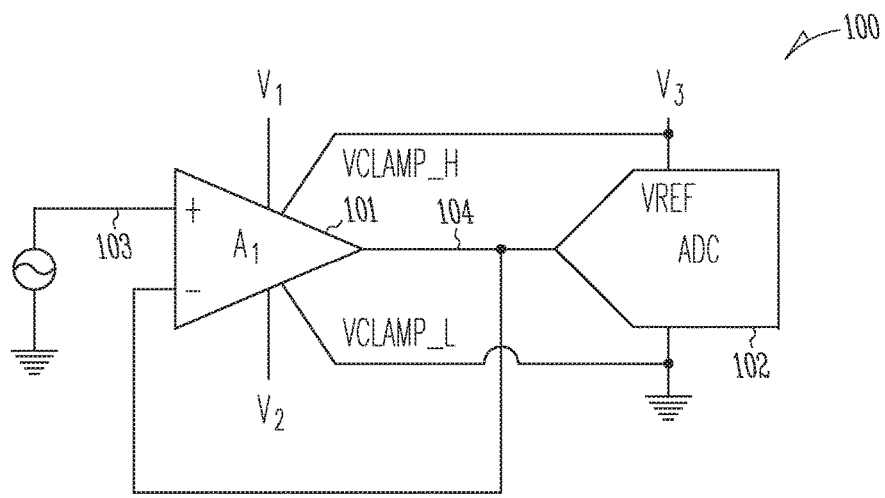
FIG. 1 illustrates generally an example ADC system. The system can include an amplifier and an ADC.

Analog to digital converters (ADCs) are electronic devices that convert a continuous physical quantity carried by an analog input or signal to a digital number or output that represents the quantity's amplitude (or to a digital signal carrying that digital number). The conversion involves quantization of the analog input signal, so it would introduce a small amount of error. Typically the quantization occurs through periodic sampling of the analog input signal. The result is a sequence of digital values (i.e., a digital signal) that has converted a continuous-time and continuous-amplitude analog input signal to a discrete-time and discrete-amplitude digital signal.

An ADC is usually defined by the following application requirements: its bandwidth (the range of frequencies of analog signals it can properly convert to a digital signal), its resolution (the number of discrete levels the maximum analog signal can be divided into and represented in the digital signal), and its signal to noise "SNR" ratio (how accurately the ADC can measure signal relative to the noise the ADC introduces). Analog-to-digital converters (ADCs) have many different designs, which can be chosen based on the application requirements.

In general, the analog signal sensed by the ADC can be provided by an upstream amplifier. The amplifier can provide a gain such that the range of the analog signal is commensurate with the input range of ADC. Even in systems that one might consider well matched, the amplifier can receive a supply voltage that can have a minimum supply voltage or maximum supply voltage that is outside the input range of the ADC. Anomalies can occur that can allow the amplifier to provide an output voltage close to the supply voltage and outside the sense-able input range of the ADC.

In certain applications, receiving an input voltage outside the input range of the ADC can result in the output of the ADC not providing an accurate digital conversion for as long as the input signal is outside the input range of the ADC. In some applications, due to the recovery time of the ADC when excursions of the input voltage progress significantly outside the sense-able input range of the ADC, the output of the ADC can remain inaccurate for some time even after the input signal voltage comes back within the sense-able input range of the ADC. Conventional attempts to limit the output current voltage do so by sourcing or sinking current at the output of the amplifier. Such techniques can use significant power and can, via the significant changes in amplifier output current, also disrupt reference voltage sources supplied to other amplifiers or ADCs. Without some type of output current limiting, ESD circuits can be damaged, or will need to be physically large or somewhat complex, characteristics that will turn away many potential customers.

The present inventors have recognized amplifier techniques that can limit the output of the amplifier very near voltage limits distinct from the supply voltage limits of the amplifier, such as voltage limits very near the sensing limits of an ADC receiving the output of the amplifier. In certain examples, the voltage limiting techniques can override the gain of the amplifier to accomplish the voltage limiting function, thus, amplifier output current is not directly affected by the voltage limiting functions of the amplifier.

FIG. 1 illustrates generally an example ADC system 100. In certain examples, the system 100 can include an amplifier 101 and an ADC 102. The amplifier 101 can receive an analog signal 103 and provide a processed analog signal 104 to the ADC 102. The ADC 102 can convert the processed analog signal 104 to a digital signal for digital processing. The amplifier 101 can receive the analog signal 103 from a variety of sources including, but not limited to, an industrial sensor or a medical sensor, for example. In some examples, the amplifier 101 can have a gain that allows the amplifier 101 to provide an amplified, a buffered or an attenuated version of the analog signal 103 to the ADC 102. In certain examples, the voltage range of the output of the amplifier 101 can extend from one power supply rail ($V_1$) to the other supply rail ($V_2$). In certain examples, the amplifier 101 has one or more distinct inputs for receiving an output voltage threshold ($V_{CLAMP\_H}$, $V_{CLAMP\_L}$). In the illustrated example, the output voltage thresholds ($V_{CLAMP\_H}$, $V_{CLAMP\_L}$) correspond to the supply voltage ($V_3$, GND) of the ADC 102, however, it is understood that other voltages sources can be used for providing the voltage thresholds ($V_{CLAMP\_H}$, $V_{CLAMP\_L}$) without departing from the present subject matter. In certain examples, as the input analog signal 103 can cause the voltage of the processed signal 104 to traverse one of the voltage thresholds ($V_{CLAMP\_H}$, $V_{CLAMP\_L}$), and clamp circuits of the amplifier 101 can clamp the output voltage of the amplifier 101 at or very near the voltage threshold without sinking or sourcing current directly with the output of the amplifier 101.

Figure 2:
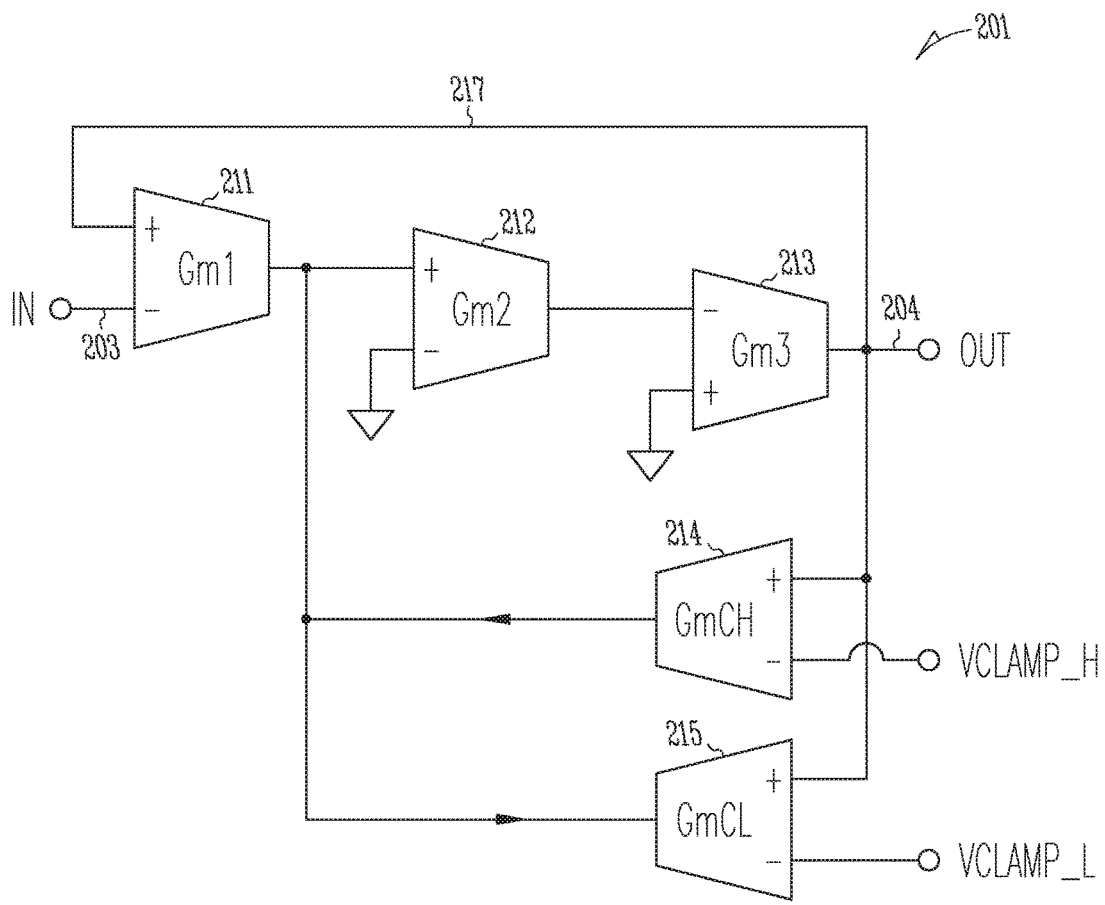
FIG. 2 illustrates generally an example amplifier for limiting the output voltage of the amplifier without shunting current directly from the output of the amplifier.

FIG. 2 illustrates generally an example amplifier 201 for limiting the output voltage of the amplifier 201 without directly disrupting the output current of the amplifier 201. In certain examples, the amplifier 201 can include one or more amplifier stages 211, 212, 213, and an input to receive an input analog signal (IN) 203, an output to provide the processed analog signal (OUT) 204, one or more inputs for receiving voltage limit thresholds ($V_{CLAMP\_H}$, $V_{CLAMP\_L}$), and one or more clamp circuits, clamp amplifiers 214, 215, or clamp comparators, for limiting the output voltage of the amplifier 201 at or near the voltage limit thresholds ($V_{CLAMP\_H}$, $V_{CLAMP\_L}$). In general, the amplifier stages 211, 212, 213 and first feedback path can multiply the voltage of the analog input signal 203 by each stages respective gain to provide the processed analog output signal 204. As the voltage of the processed analog put signal 204 violates one of the voltage limit thresholds ($V_{CLAMP\_H}$, $V_{CLAMP\_L}$), current of the output of the first amplifier stage 211, or input current of a subsequent amplifier stage, can be modified, or adjusted, to change the overall gain of the amplifier 201 such that the voltage of the processed analog output signal 204 is clamped at or near the respective voltage limit threshold ($V_{CLAMP\_H}$, $V_{CLAMP\_L}$). Unlike conventional methods of clamping an output voltage of an amplifier, the above techniques do not directly alter the output current of the amplifier, but instead, can alter the gain of the amplifier, or override the gain of a stage of the amplifier. In addition, amplifier voltage limit clamping techniques as discussed herein can minimize current draw during an overvoltage clamping event which can also reduce power dissipation during the clamp condition compared to conventional clamp techniques that directly affect the output current of the amplifier.

In the particular example of FIG. 2, the amplifier 201 is configured for single-ended analog signals and includes three transconductance amplifier stages 211, 212, 213 and two transconductance voltage clamp amplifiers 214, 215. In certain examples, each voltage clamp amplifier 214, 215 can be a unidirectional clamp amplifier such that the clamp amplifier does not provide an output if the output of the amplifier does not violate the corresponding clamp threshold or voltage limit threshold ($V_{CLAMP\_H}$, $V_{CLAMP\_L}$). With respect to the upper voltage limit, as the output voltage of the amplifier exceeds the upper voltage thershold ($V_{CLAMP\_H}$), the upper voltage limit transconductance amplifier 214 can source current to the output of the first amplifier stage 211 or the input of the second amplifier stage 212. The sourced current can raise the voltage at the non-inverting input of the second stage 212. The rising voltage at the non-inverting input of the second stage 212 can drive the voltage up at the inverting input of the third stage 213. The rising voltage at the inverting input of the third stage 213 can drive the output voltage of the amplifier 201 down such that the output voltage (OUT) remains at or near the upper voltage limit threshold ($V_{CLAMP\_H}$).

In a similar fashion, with respect to the lower voltage limit, as the output voltage of the amplifier exceeds the lower voltage threshold ($V_{CLAMP\_L}$), the lower voltage limit transconductance amplifier 215 can sink current from the output of the first amplifier stage 211 or the input of the second amplifier stage 212. The sink current can lower the voltage at the non-inverting input of the second stage 212. The falling voltage at the non-inverting input of the second stage 212 can drive the voltage down at the inverting input of the third stage 213. The falling voltage at the inverting input of the third stage 213 can drive the output voltage (OUT) of the amplifier up such that the output voltage (OUT) remains at or near the lower voltage limit threshold ($V_{CLAMP\_L}$).

Figure 3A:
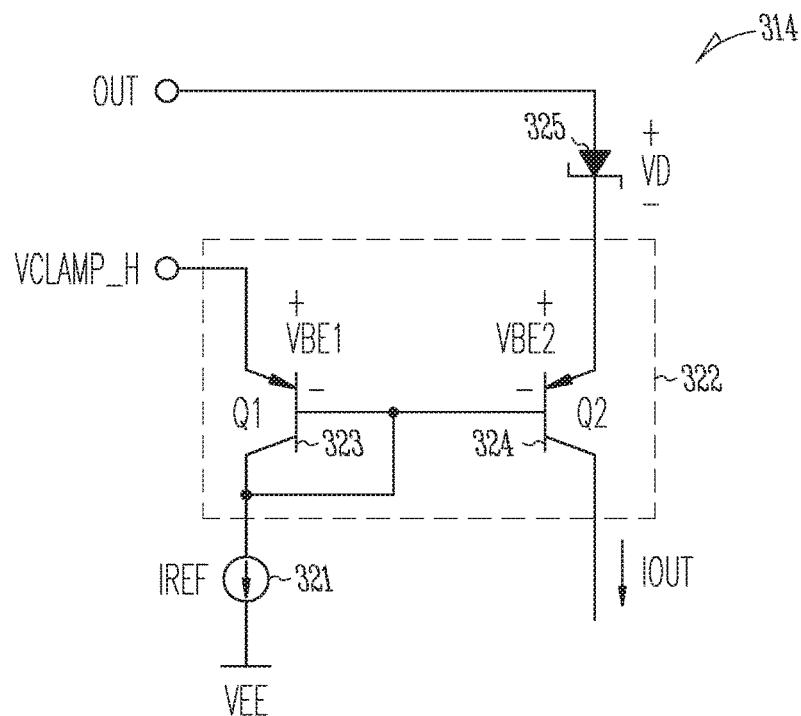
FIGS. 3A and 3B illustrate generally examples of a voltage limit amplifier.
Figure 3B:
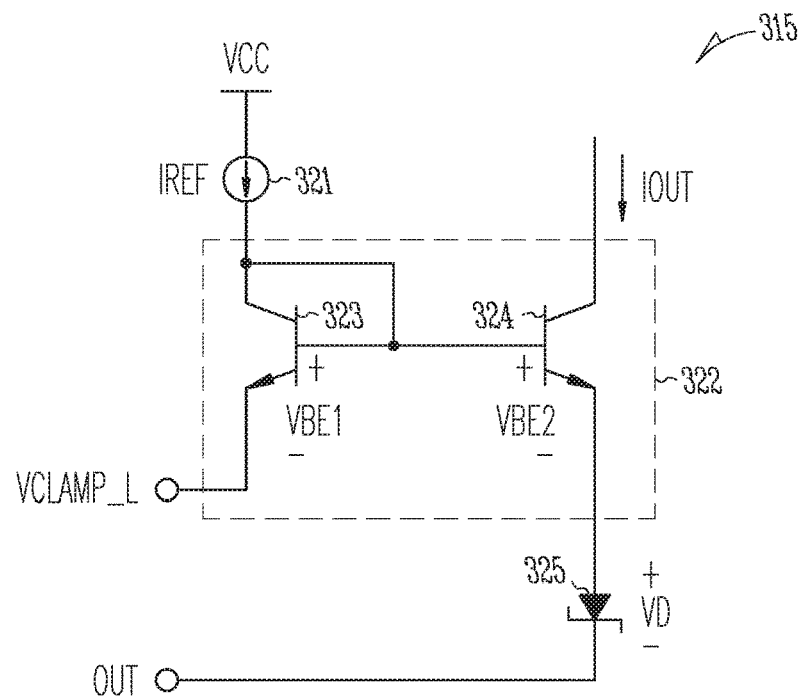

FIGS. 3A and 3B illustrate generally examples of a voltage limit amplifier 314, 315. FIG. 3A illustrates generally an example of an upper voltage clamp amplifier 314 and FIG. 3B illustrates generally an example of a lower voltage clamp amplifier 315. In certain examples, each voltage clamp amplifier 314, 315 can include a current source 321 and a clamp circuit 322. The clamp circuit 322 can include a first transistor 323 and a second transistor 324. The first transistor 323 can be a diode connected, can receive the voltage limit threshold ($V_{CLAMP\_H}$, $V_{CLAMP\_L}$), and can provide level shifting to a threshold voltage (Vt) of the second transistor 324. The second transistor 324 can receive a representation of an output voltage (OUT) of the amplifier and can provide a clamp or error current ($I_{OUT}$) as the emitter becomes greater than or less than the corresponding voltage limit threshold ($V_{CLAMP\_H}$, $V_{CLAMP\_L}$). In certain examples, the desired voltage limit of the amplifier can be either a zero offset or a non-zero offset from the voltage limit threshold ($V_{CLAMP\_H}$, $V_{CLAMP\_L}$) and the diode 325 can provide the additional non-zero offset voltage to the turn-on point, and can also protect the base-emitter junction of 324 from reverse-bias breakdown.

Figure 4:
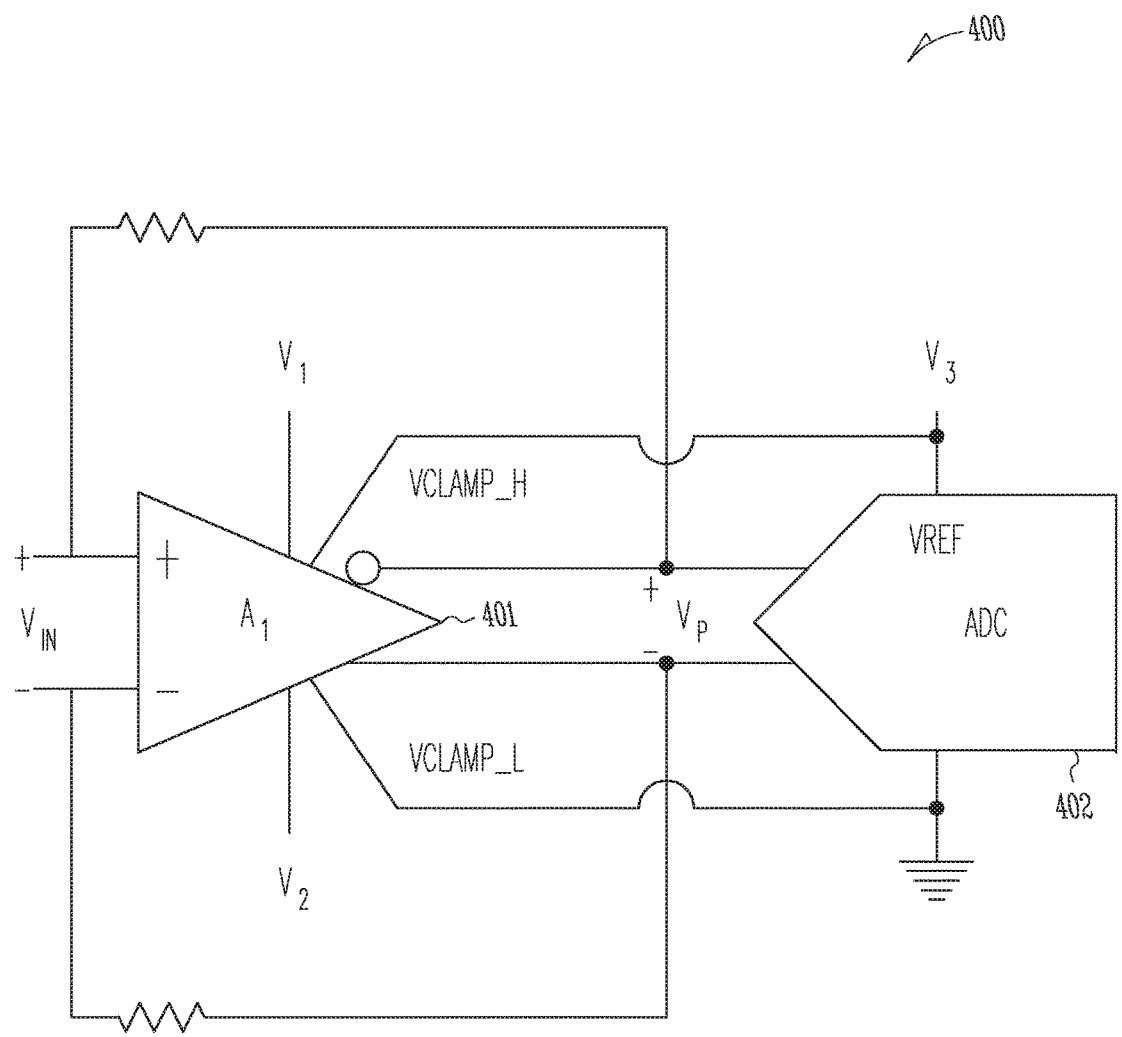
FIG. 4 illustrates generally an example differential ADC system.

FIG. 4 illustrates generally an example differential ADC system 400. In certain examples, the system 400 can include a differential ADC 402 and a differential amplifier 401. The differential amplifier 401 can include inputs for the differential input signal ($V_{IN}$) to be digitized, inputs for supply power ($V_1$, $V_2$), differential outputs for providing or distributing the processed signal ($V_P$) of the differential amplifier 401, and inputs for an upper voltage threshold ($V_{CLAMP\_H}$) and for a lower voltage threshold ($V_{CLAMP\_L}$). In some examples, the upper and lower voltage thresholds ($V_{CLAMP\_H}$, $V_{CLAMP\_L}$) can be directly derived from, or connected to, the supply voltages ($V_3$, GND) or a reference voltage of the ADC 402. In certain examples, the amplifier 401 can use the upper and lower voltage thresholds ($V_{CLAMP\_H}$, $V_{CLAMP\_L}$) to clamp the differential output voltage ($V_P$) of the differential amplifier 401 to a range of voltages between the upper and lower voltage thresholds ($V_{CLAMP\_H}$, $V_{CLAMP\_L}$). In some examples, the amplifier 402 can clamp the output voltage ($V_P$) of the amplifier 401 within an offset of the upper and/or lower voltage threshold ($V_{CLAMP\_H}$, $V_{CLAMP\_L}$). In certain examples, the differential amplifier 401 can have a common-mode feedback loop that can be modeled as a single-ended amplifier and clamped in the same manner as the single-ended amplifier of FIG. 1.

In certain examples, using the supply voltages ($V_3$, GND) of the ADC 402 can ensure that the output signal ($V_P$) of the amplifier 401 is capable of spanning the entire input range of the ADC 402 thus providing a signal that can take full advantage of the resolution of the ADC 402. In some ADCs, even if protected from harmful voltages, if the input voltage to the ADC is allowed to significantly exceed the measurable input range of the ADC, the ADC may need a significant amount of time to recover and provide accurate digital representations of the input signal even after the voltage of the input signal to the ADC returns within the measurable range of the ADC. Thus, having an amplifier clamp the output voltage near the measurable limits of the ADC can help ensure that once the input signal returns to a value within the measurable range of the ADC, the ADC can quickly begin to provide accurate digital representations of the input signal.

Figure 5:
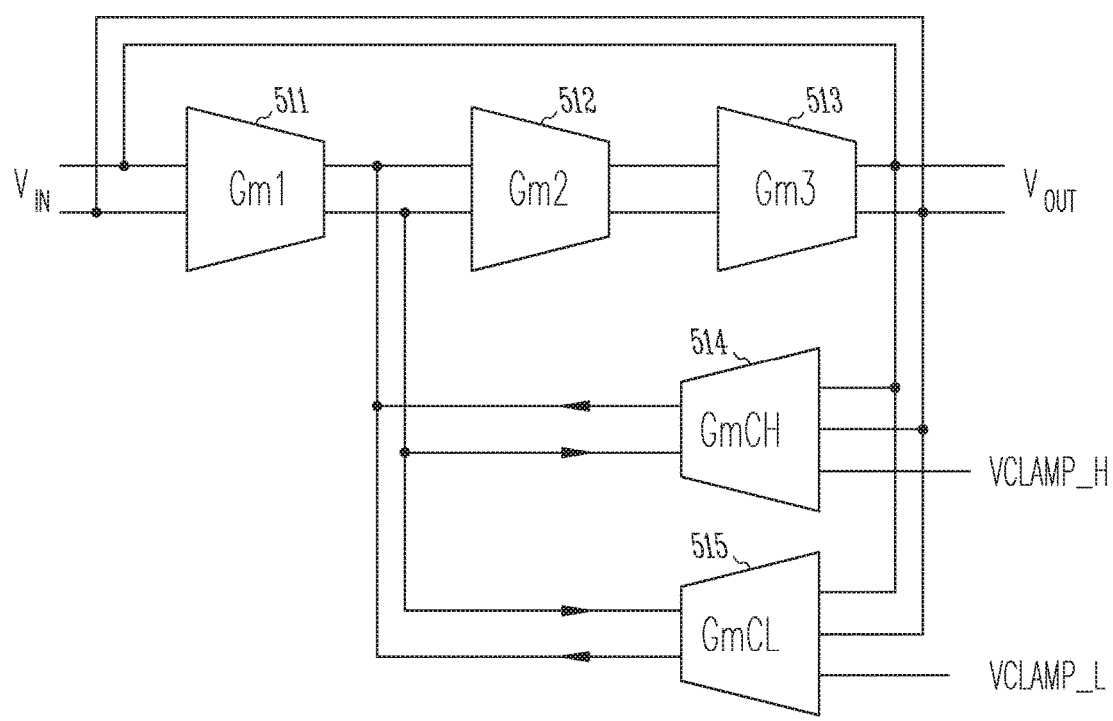
FIG. 5 illustrates generally an example amplifier for limiting the output voltage of the amplifier without shutting current directly from the output of the amplifier.

FIG. 5 illustrates generally an example amplifier 501 for limiting the output voltage ($V_{OUT}$) of the amplifier 501 without directly disrupting the output current of the amplifier 501. In certain examples, the amplifier 501 can include one or more amplifier stages 511, 512, 513, and an input to receive an input analog signal ($V_{IN}$), an output to provide the processed analog signal ($V_{OUT}$), one or more inputs for receiving voltage limit thresholds ($V_{CLAMP\_H}$, $V_{CLAMP\_L}$), and one or more clamp circuits, clamp amplifiers 514, 515, or clamp comparators, for limiting the output voltage ($V_{OUT}$) of the amplifier 501 at or near the voltage limit thresholds ($V_{CLAMP\_H}$, $V_{CLAMP\_L}$). In general, the amplifier stages 511, 512, 513 and first feedback path can multiply the voltage of the analog input signal ($V_{IN}$) by each stages' respective gain to provide the processed analog output signal ($V_{OUT}$). As the voltage of the processed analog output signal ($V_{OUT}$) violates one of the voltage limit thresholds ($V_{CLAMP\_H}$, $V_{CLAMP\_L}$), current of the output of the first amplifier stage 511 can be adjusted to change the overall gain of the amplifier 501 such that the voltage of the processed analog output signal ($V_{OUT}$) is clamped at or near the respective voltage limit threshold ($V_{CLAMP\_H}$, $V_{CLAMP\_L}$).

Figure 6:
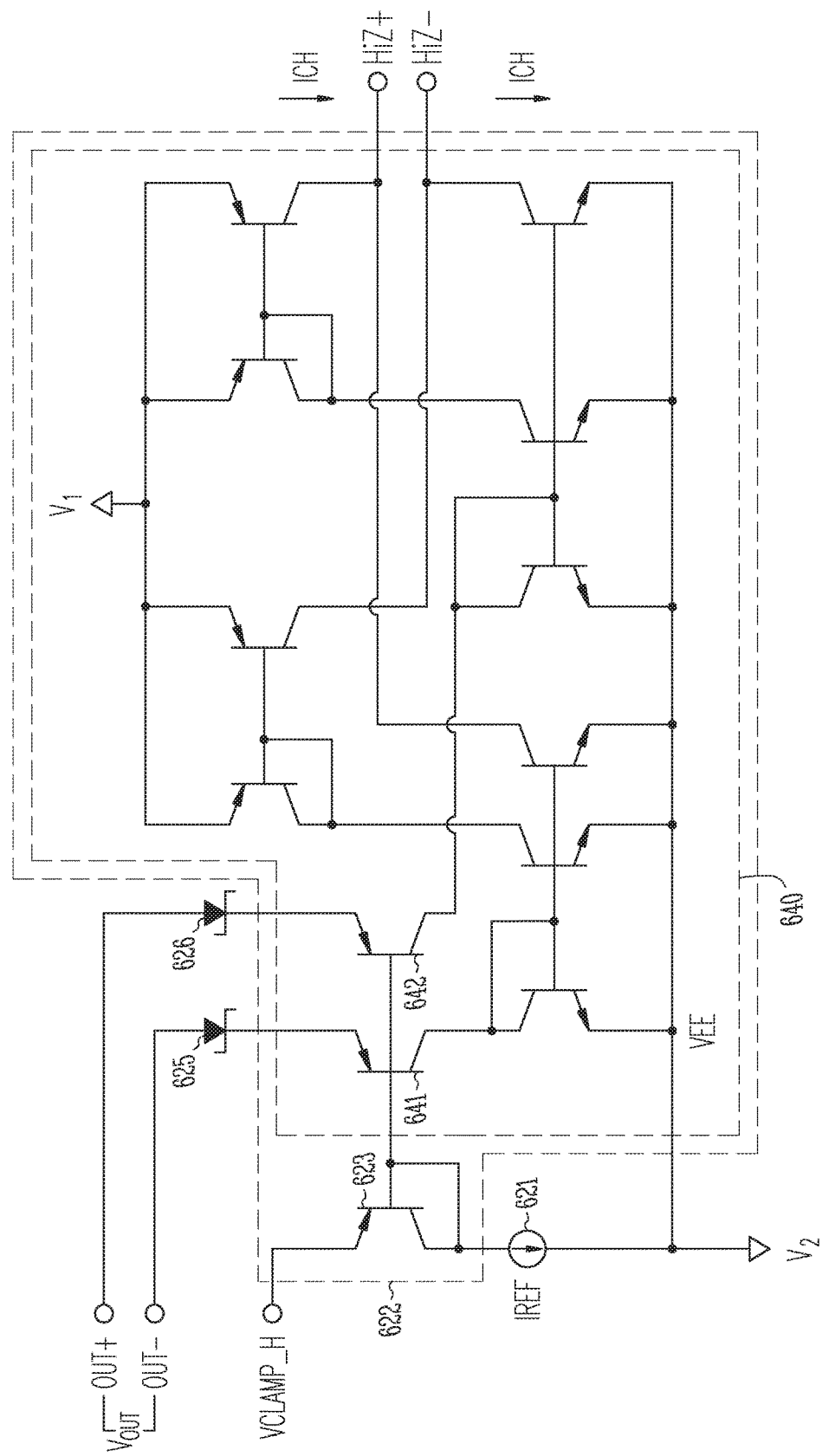
FIG. 6 illustrates generally an example high voltage clamp circuit for a differential driver amplifier.

FIG. 6 illustrates generally an example high voltage clamp circuit 614 for a differential driver amplifier. The high voltage clamp circuit 614 can include a current source 621 and a multiple-stage current mirror 622. The current mirror 622 can include a sense transistor 623 coupled to the high voltage threshold input ($V_{CLAMP\_H}$) and to the current reference 621. The multiple-stage current mirror 622 also includes a mirror circuit 640 that includes a first mirror transistor 641 configured to receive a voltage from a first output (OUT+) of the differential outputs of the amplifier and a second mirror transistor 642 configured to receive a voltage from the other output (OUT−) of the differential outputs of the amplifier. Each of the first and second mirror transistors 641, 642 can trigger current flow in the additional current mirror stages of the current mirror circuit 640. As the differential output voltage ($V_{OUT}$) exceeds the high voltage threshold ($V_{CLAMP\_H}$), the sense transistor 623 and corresponding mirror circuit 640 can start to modify current at differential inputs of an amplifier stage of the differential amplifier, the outputs (HiZ+, HiZ−) of the high voltage clamp circuit 614, to reduce the gain of the amplifier and clamp the output voltage ($V_{OUT}$) at the high voltage threshold ($V_{CLAMP\_H}$). In certain examples, a diode 625, 626 can connect one or more of the differential outputs (OUT+, OUT−) of the amplifier with the corresponding first or second mirror transistor 641, 642 to allow the output voltage ($V_{OUT}$) to clamp at an offset voltage from the high voltage threshold ($V_{CLAMP\_H}$).

Figure 7:
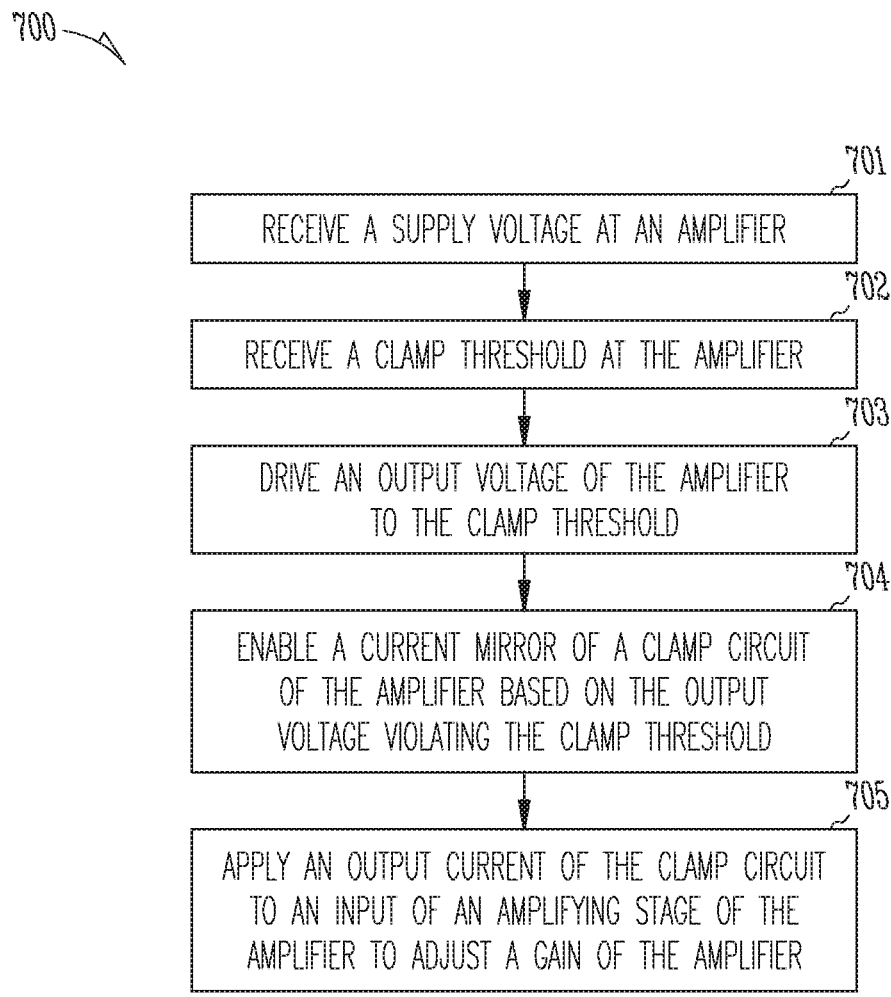
FIG. 7 illustrates generally a method of clamping an output of an ADC driver amplifier without interfering directly with output current of the ADC driver amplifier and without disrupting supply voltages of the amplifier or ADC.

FIG. 7 illustrates generally a method of clamping an output of an ADC driver amplifier without interfering directly with output current of the ADC driver amplifier and without disrupting supply voltages of the amplifier or ADC. In certain examples, the method can clamp output voltage of the amplifier without directly diverting current at the output of the amplifier. At 701, the amplifier can receive a supply voltage for driving the output of the amplifier. At 702, the amplifier can receive one or more clamp thresholds. In certain examples, the clamp thresholds can be at voltages between the supply voltages of the amplifier. In some examples, a high voltage threshold can be 1 or more volts less than a high supply voltage of the amplifier. In some examples, a low voltage threshold can be 1 or more volts higher than a low supply voltage of the amplifier. At 703, an output voltage of the amplifier, as a function of the input voltage of the amplifier, can be driven to a voltage threshold. At 704, the output voltage of the amplifier can enable a current mirror of an output voltage clamp circuit to modify current at an input to an internal stage of the amplifier. At 705, a gain of the amplifier can be modified by applying a current output of the output voltage clamp to an input of an amplifying stage of the amplifier to keep the output voltage at or near the voltage threshold until the input voltage of the amplifier moves to a value that allows the output of the amplifier to not violate the voltage threshold.

VARIOUS NOTES & EXAMPLES

The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, the terms "including" and "comprising" are open-ended, that is, a system, device, article, composition, formulation, or process that includes elements in addition to those listed after such a term are still deemed to fall within the scope of subject matter discussed. Moreover, such as may appear in a claim, the terms "first," "second," and "third," etc. are used merely as labels, and are not intended to impose numerical requirements on their objects.

Method examples described herein can be machine or computer-implemented at least in part. Some examples can include a computer-readable medium or machine-readable medium encoded with instructions operable to configure an electronic device to perform methods as described in the above examples. An implementation of such methods can include code, such as microcode, assembly language code, a higher-level language code, or the like. Such code can include computer readable instructions for performing various methods. The code may form portions of computer program products. Further, in an example, the code can be tangibly stored on one or more volatile, non-transitory, or non-volatile tangible computer-readable media, such as during execution or at other times. Examples of these tangible computer-readable media can include, but are not limited to, hard disks, removable magnetic disks, removable optical disks (e.g., compact disks and digital video disks), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of a claim. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. The following aspects are hereby incorporated into the Detailed Description as examples or embodiments, with each aspect standing on its own as a separate embodiment, and it is contemplated that such embodiments can be combined with each other in various combinations or permutations.

What is claimed is:

1. An amplifier configured to clamp an output voltage based on a voltage limit without requiring alteration of an output current of the amplifier to maintain a clamped output condition, the amplifier comprising:
    a plurality of amplifier stages configured to receive an input voltage and to provide the output voltage as a function of the input voltage; and
    a comparator configured to receive the voltage limit and a representation of the output voltage of the amplifier, to adjust current at an input to a first amplifier stage of the plurality of amplifier stages when the output voltage violates the voltage limit, and to clamp the output voltage at an offset from the voltage limit.

2. The amplifier of claim 1, wherein the voltage limit is received at an input of the amplifier that is distinct from a supply voltage input of the amplifier.

3. The amplifier of claim 1, wherein the voltage limit is generated by the amplifier and is distinct from the supply voltage of the amplifier.

4. The amplifier of claim 1, wherein the comparator is a transconductance amplifier.

5. The amplifier of claim 1, including differential input terminals configured to receive the input voltage; and
    differential output terminals configured to provide the output voltage.

6. The amplifier of claim 1, wherein the comparator includes:
    a clamp circuit;
    a current reference coupled to a first transistor of the clamp circuit; and
    a diode coupled to a second transistor of the clamp circuit and configured to receive the representation of the output voltage of the amplifier.

7. The amplifier of claim 6, wherein a control node of the first transistor is directly coupled to a control node of the second transistor.

8. The amplifier of claim 6, wherein the diode is configured to provide the offset.

9. A method for limiting an output voltage of an amplifier without requiring alteration of an output current of the amplifier to maintain a clamped output condition, the method comprising:
    amplifying an input voltage using an amplifier stage of the amplifier to provide an output voltage;
    receiving a voltage limit;
    offsetting the voltage limit to provide an offset voltage limit;
    comparing a representation of the output voltage to the offset voltage limit; and
    adjusting an input current of the amplifier stage when the output voltage violates the offset voltage limit.

10. The method of claim 9, including:
    receiving a supply voltage at a first input of the amplifier; and
    receiving the offset voltage limit at a second input of the amplifier.

11. The method of claim 9, wherein the comparing includes:
    receiving the output voltage and the offset voltage limit at inputs of a transconductance amplifier; and
    providing an error current at an output of the transconductance amplifier.

12. The method of claim 9, wherein the voltage limit is a high voltage threshold.

13. The method of claim 9, wherein adjusting an input current of the amplifier stage when the output voltage violates the offset voltage limit includes adjusting an input current of the amplifier stage when the output voltage violates one of a high voltage threshold or a low voltage threshold.

14. The method of claim 9, wherein the amplifying includes amplifying a differential input voltage using an amplifier stage of the amplifier to provide a differential output voltage;
    wherein the comparing includes comparing a representation of the differential output voltage to an offset voltage limit; and
    wherein the adjusting an input current of the amplifier stage includes adjusting a differential input current of the amplifier stage when the differential output voltage violates the offset voltage limit.

15. A system for limiting an input voltage of an analog-to-digital converter (ADC), the system comprising:
    the ADC; and
    an amplifier having an output coupled to an input of the ADC, the amplifier including:
    a plurality of amplifier stages configured to receive an input voltage and to provide an output voltage as a function of the input voltage; and
    a comparator configured to receive a voltage limit and a representation of the output voltage of the amplifier, to adjust current at an input to a first amplifier stage of the plurality of amplifier stages when the output voltage violates the voltage limit, and to clamp the output voltage at an offset from the voltage limit.

16. The system of claim 15, wherein the comparator is a high clamp comparator and the voltage limit is a high voltage threshold, the high clamp comparator configured to receive a supply voltage of the ADC as the high voltage threshold.

17. The system of claim 16, wherein the amplifier includes a low clamp comparator configured to receive a second supply voltage of the ADC as a low voltage threshold, to adjust current at an input to a first amplifier stage of the plurality of amplifier stages when the output voltage violates the low voltage threshold, and to clamp the output voltage at an offset from the low voltage threshold.

18. The system of claim 17, wherein the ADC includes a differential input, and the amplifier is a differential amplifier.

19. The system of claim 17, wherein high clamp comparator includes a first transconductance amplifier; and
wherein the low clamp comparator includes a second transconductance amplifier.

20. The system of claim 15, wherein a single integrated circuit die includes the ADC and the amplifier.

* * * * *